(12) United States Patent
Kashyap et al.

(10) Patent No.: US 7,475,372 B2
(45) Date of Patent: Jan. 6, 2009

(54) METHODS FOR COMPUTING MILLER-FACTOR USING COUPLED PEAK NOISE

(75) Inventors: Chandramouli V. Kashyap, Portland, OR (US); Gregory Michael Schaeffer, Poughkeepsie, NY (US); David J. Widiger, Pflugerville, TX (US)

(73) Assignee: International Business Machines Corporation, Armonk, NY (US)

( * ) Notice: Subject to any disclaimer, the term of this patent is extended or adjusted under 35 U.S.C. 154(b) by 402 days.

(21) Appl. No.: 11/160,701

(22) Filed: Jul. 6, 2005

(65) Prior Publication Data

US 2007/0011630 A1    Jan. 11, 2007

(51) Int. Cl.
*G06F 17/50* (2006.01)
(52) U.S. Cl. .................................. 716/6; 716/1; 716/2
(58) Field of Classification Search .............. 716/1, 716/2, 6
See application file for complete search history.

(56) References Cited

U.S. PATENT DOCUMENTS

| | | | |
|---|---|---|---|
| 6,467,069 B2 | 10/2002 | Mehrotra et al. | |
| 6,510,540 B1 | 1/2003 | Krauter et al. | |
| 6,523,149 B1 | 2/2003 | Mehrotra et al. | |
| 6,532,574 B1 * | 3/2003 | Durham et al. | 716/6 |
| 6,601,222 B1 | 7/2003 | Mehrotra et al. | |
| 6,615,395 B1 | 9/2003 | Hathaway et al. | |
| 6,651,229 B2 | 11/2003 | Allen et al. | |
| 6,760,895 B2 * | 7/2004 | Ito et al. | 716/10 |
| 2004/0060022 A1 | 3/2004 | Allen et al. | |
| 2004/0078176 A1 | 4/2004 | Bowen et al. | |

OTHER PUBLICATIONS

F. Dartu et al., "Calculating Worst-Case Gate Delays Due to Dominant Capacitance Coupling," Carnegie Mellon Univ., Dept. of ECE, pp. 46-51, 1997.
P. D. Gross et al., "Determination of Worst-Case Aggressor Alignment for Delay Calculation," Carnegie Mellon Univ., Dept. of ECE, pp. 212-219, 1998.
P. Chen et al., "Towards True Crosstalk Noise Analysis," U.C. Berkeley, Dept. of EECS, 1999.
P. Chen et al., "Miller Factor for Gate-Level Coupling Delay Calculation," U.C. Berkeley, Dept. of EECS, pp. 68-74, 2000.
P. Dasgupta et al., "A Novel Metric for Interconnect Architecture Performance," UCSD, CSE Dept., pp. 1-6, 2003.
P. Chen et al., "Switching Window Computation for Static Timing Analysis in Presence of Crossstalk Noise," U.C. Berkeley, Dept. of EECS.

* cited by examiner

*Primary Examiner*—Thuan Do
(74) *Attorney, Agent, or Firm*—Ohlandt, Greeley, Ruggiero & Perle, L.L.P.; Steve Capella, Esq.

(57) ABSTRACT

A method for computing a Miller-factor compensated for peak noise provided. The method includes mapping at least two delays as function of at least two Miller-factors; determining an equation of the function; computing a peak noise; computing a peak delay resulting from the peak noise; and computing the compensated Miller-factor based on the equation and the peak delay. The function can be either a linear function or a non-linear function.

11 Claims, 7 Drawing Sheets

METHODS FOR COMPUTING MILLER-FACTOR USING COUPLED PEAK NOISE

BACKGROUND OF THE INVENTION

The present disclosure relates to the design of integrated circuits. More particularly, the present disclosure relates to methods for computing Miller-factors using coupled noise peak.

In electrical circuits, noise is an extraneous signal that can be capacitively coupled into a digital circuit from other parts of the system. One source of noise is a signal pickup from a changing voltage on another wire, such as a nearby logic signal wire, also known as a "net", which connects two or more electronic circuit components.

In the design of electric circuits, such as semiconductor chip design, it can be important to verify the noise, which may be induced on a "victim" net of the chip by its neighboring "aggressor" nets. Specifically, the aggressor nets can cause speed changes in the victim nets when the aggressor net and the victim net switch in opposite directions.

The use of de-coupling factors, such as Miller-factors, have been proposed as a convenient method to reduce a highly coupled circuit to a simpler de-coupling circuit approximation. Specifically, a coupled victim net can be replaced with an uncoupled net by multiplying the coupling capacitances by a Miller-factor or k-factor and connecting the coupling capacitances to ground.

Static timing analyzers determine the Miller-factor as a function of slew rates and arrival times (AT's) as described in U.S. Pat. No. 6,615,395. Unfortunately, the static timing analysis does not account for the noise when computing the Miller-factor. Rather, the static timing analysis typically assumes that the Miller-factor is fixed at a maximum of 2 (or some user specified maximum value) for opposite direction switching or is fixed at 0 (or some user specified minimum value) for same direction switching. However, these fixed approximates have not proven accurate for sub-micron circuitry.

Accordingly, it has been determined that it would be advantageous to have improved methods of computing Miller-factors, which account for the coupled noise peak.

BRIEF DESCRIPTION OF THE INVENTION

It is an object of the present disclosure to provide methods for computing Miller-factors for coupling capacitance.

It is another object of the present disclosure to provide methods for computing Miller-factors using the peak noise injected on the victim, where the peak noise can be computed by existing tools.

These and other objects and advantages of the present disclosure are provided by a method for computing a Miller-factor compensated for the peak noise. The method includes mapping at least two delays as a function of at least two Miller-factors; determining an equation of the function; computing a peak noise; computing a peak delay resulting from the peak noise; and computing the compensated Miller-factor based on the equation and the peak delay.

In still other embodiments, a method for computing a Miller-factor compensated for the peak noise is provided. The method includes computing a first delay point from a first Miller-factor; computing a second delay point from a second Miller-factor; computing a peak noise; computing a peak delay resulting from the peak noise; and computing the compensated Miller-factor based on at least the first and second delay points, the first and second Miller-factors, and the peak delay.

A method for computing a Miller-factor compensated for the peak noise is also provided that includes assuming that circuit delay as a function of Miller-factor is a linear function; determining a slope of the linear function based on at least two sets of data, each set of data comprising a delay and a corresponding Miller-factor; and computing a peak delay resulting from a peak noise; and computing the compensated Miller-factor based on the slope and the peak delay.

The above-described and other features and advantages of the present disclosure will be appreciated and understood by those skilled in the art from the following detailed description, drawings, and appended claims.

DETAILED DESCRIPTION OF THE INVENTION

Figure 1:
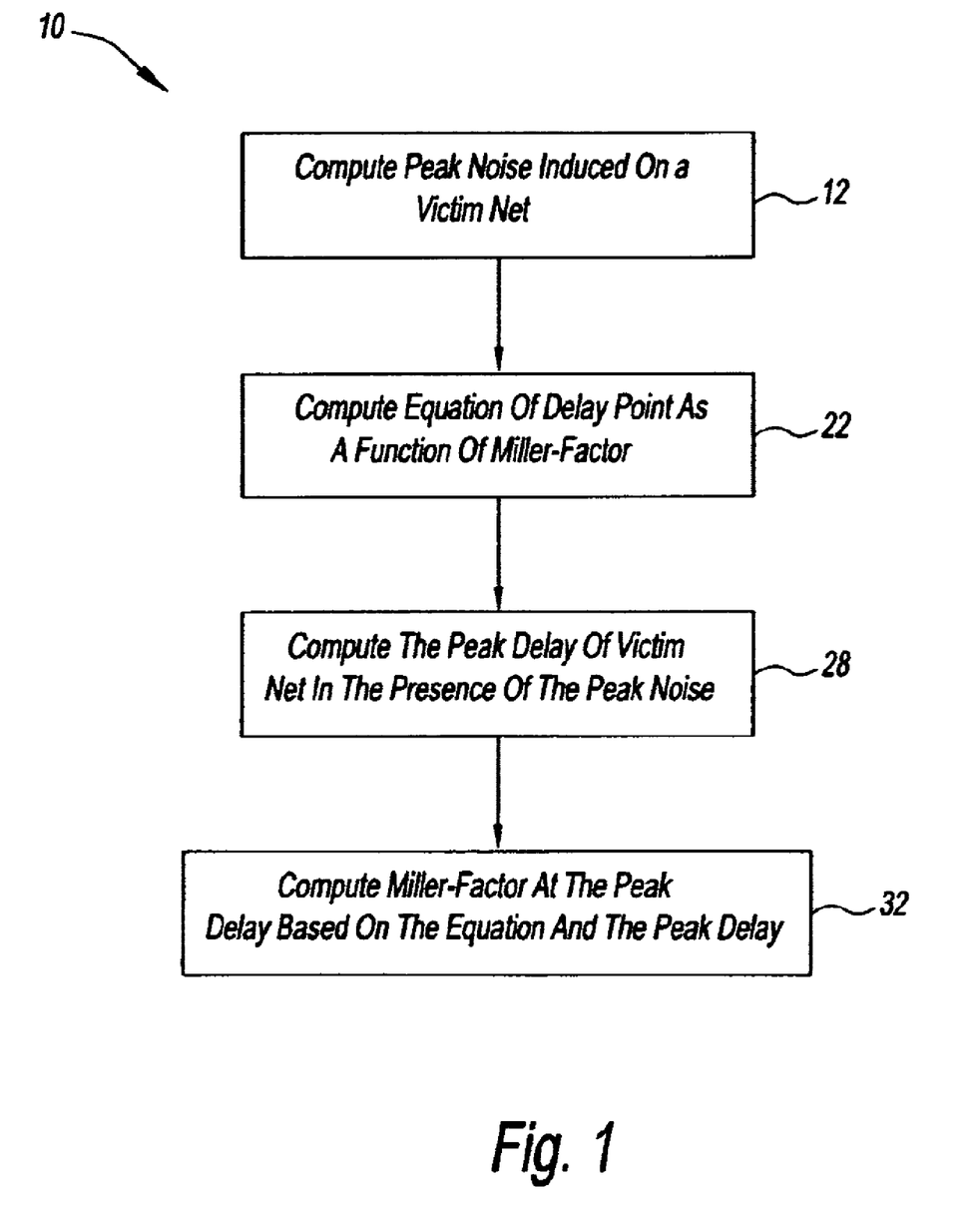
FIG. 1 is a flow chart of an exemplary embodiment of a method for computing Miller-factors according to the present disclosure.

Referring to the drawings and in particular to FIG. 1, an exemplary embodiment of a method of computing Miller-factors according to the present disclosure is illustrated by reference numeral 10. Advantageously, method 10 accounts for the noise peak during the computation of the Miller-factor and, thus, the method results in the computation of a compensated Miller-factor.

Generally, method 10 computes the peak noise induced on a victim net by its aggressor nets using existing tools and methods. Then, the method computes a change in delay of the victim net due to this peak noise. Finally, the change in delay is mapped as a function of Miller-factor, which allows the equation of the function to be computed. Once the equation of the function is computed, the compensated Miller-factor can be determined from the equation and the delay resulting from the peak noise. Once the compensated Miller-factor is determined by method 10, the timing of the circuit can be analyzed using existing methods and tools. However, the use of method 10 improves the accuracy of these existing methods and tools by accounting for noise during the computation of the compensated Miller-factor.

In one embodiment, method 10 computes the compensated Miller-factor using linear approximations. In other embodiments, method 10 computes the compensated Miller-factor using non-linear approximations.

Method 10 assumes that the design and related technology information of the integrated circuit are known (e.g., delay rules, capacitance, and resistance per unit length, etc.). For example, the design and related technology information generally has of a complete electrical schematic showing the detailed parasitic capacitance and resistance (at least on those nets that exhibit significant coupling).

Figure 2:
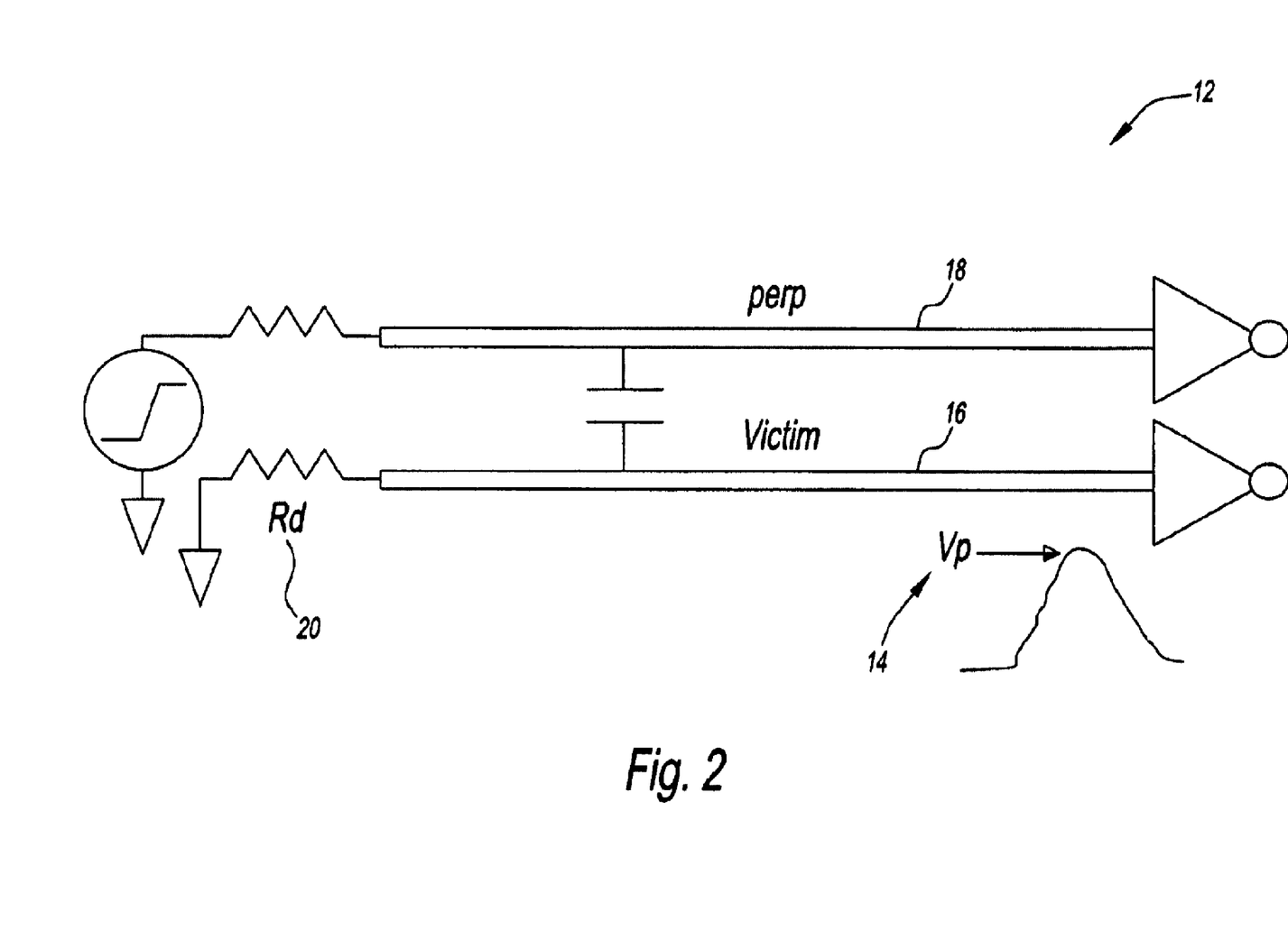
FIG. 2 is a schematic depiction of a peak noise computation for a coupled net.

Method 10 commences with a first step 12 for computing peak noise ($V_p$) 14 as shown in FIG. 2. Peak noise 14 is the maximum voltage induced on a victim net 16 by the aggressor net 18. First step 12 computes peak noise 14 using the holding driver resistance 20 of the victim net 16. For example, first step 12 can compute peak noise 14 using known tools and methods such as, but not limited to, 3DNoise software commercially available from International Business Machines, the assignee of the present application.

It has been determined by the present disclosure that the delay of a victim net 16 can be mapped as function of the Miller-factor. Thus, a minimum of two delay computations are needed when using linear approximation methods while more than two delay computations are needed when using non-linear approximation methods.

Method 10 will first be described using a linear approximation with reference to FIGS. 3 through 6, which has been determined by the present disclosure to be a substantially accurate approximation. Here, method 10 computes at least two delay points to determine slope of the linear function during a second step 22.

Figure 3:
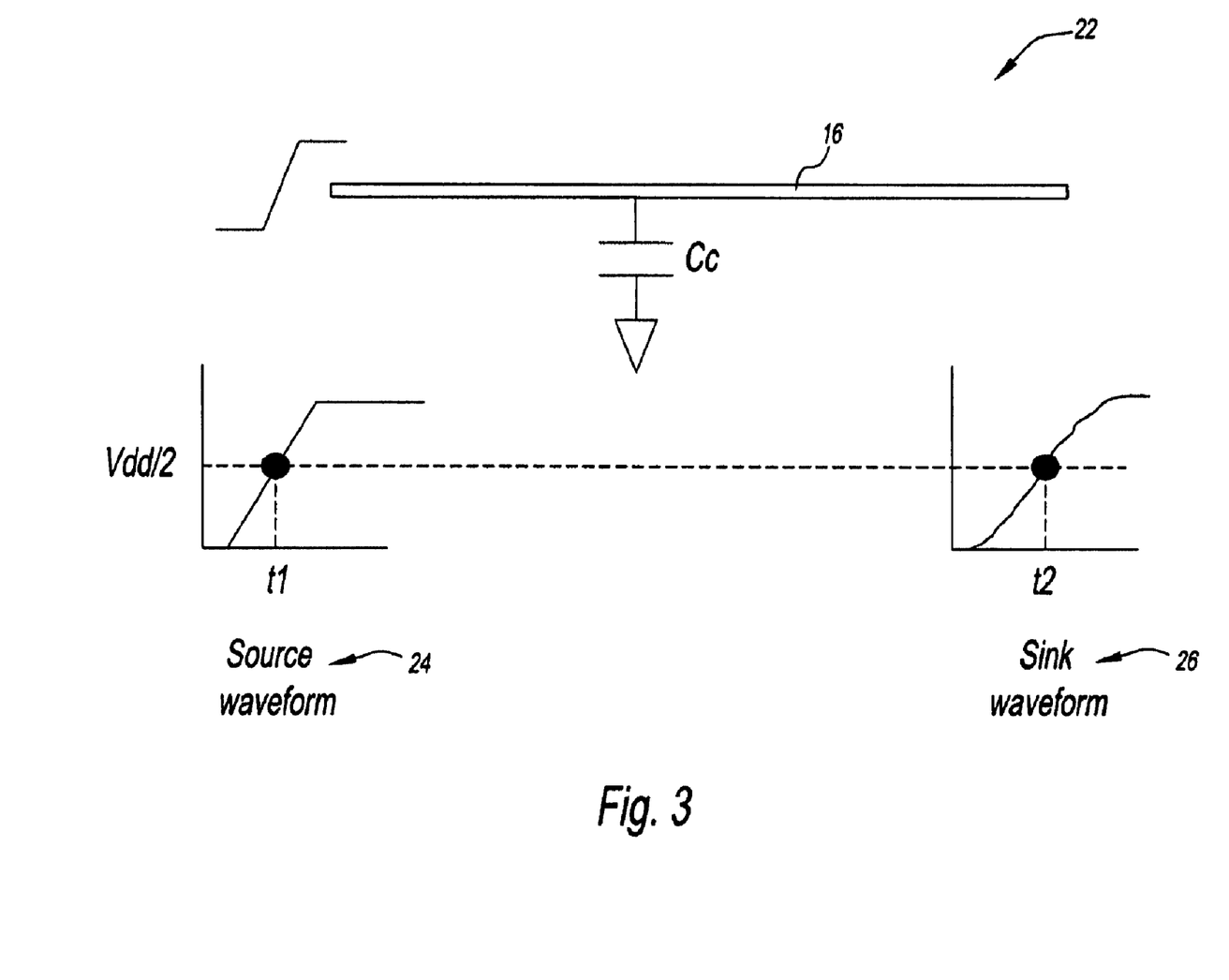
FIG. 3 is a schematic depiction of a delay computation for an uncoupled net.

One of the delay points used by method 10 during second step 22 is the delay (D1) of victim net 16 in the absence of noise (i.e., uncoupled) from aggressor net 18, namely where the Miller-factor is equal to one (i.e., K1=1). The delay (D1) is determined by the following equation: D1=t2−t1 As illustrated in FIG. 3, times t1 and t2 are determined from the source waveform 24 and the sink waveform 26, respectively, of victim net 16.

Second step 22 computes a second delay point (D2) by selecting a second Miller-factor. For example, second step 22 can determine the second delay point (D2) using a Miller-factor of two (i.e., K=2).

The delays D1 and D2 can be determined using known tools such as, but not limited to, Rapid Interconnect Circuit Evaluation (RICE) software that is also commercially available from International Business Machines, the assignee of the present application. The Delays D1 and D2 can also be approximated by other well known formulas such as, but not limited to, the Elmore formula.

Figure 4:
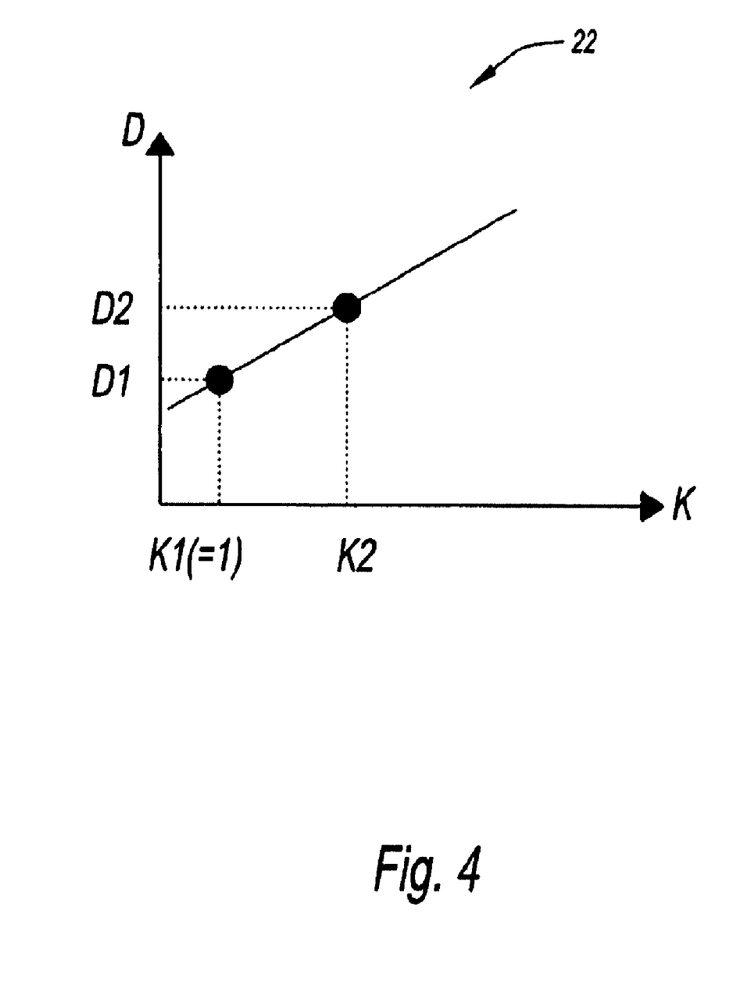
FIG. 4 is a schematic depiction of a linear approximation according to the present disclosure.

With delays D1 and D2 known, second step 22 determines the slope of the linear function using the following equation, which is shown graphically in FIG. 4:

$$Slope=(D1-D2)/(K1-K2).$$

Figure 5:
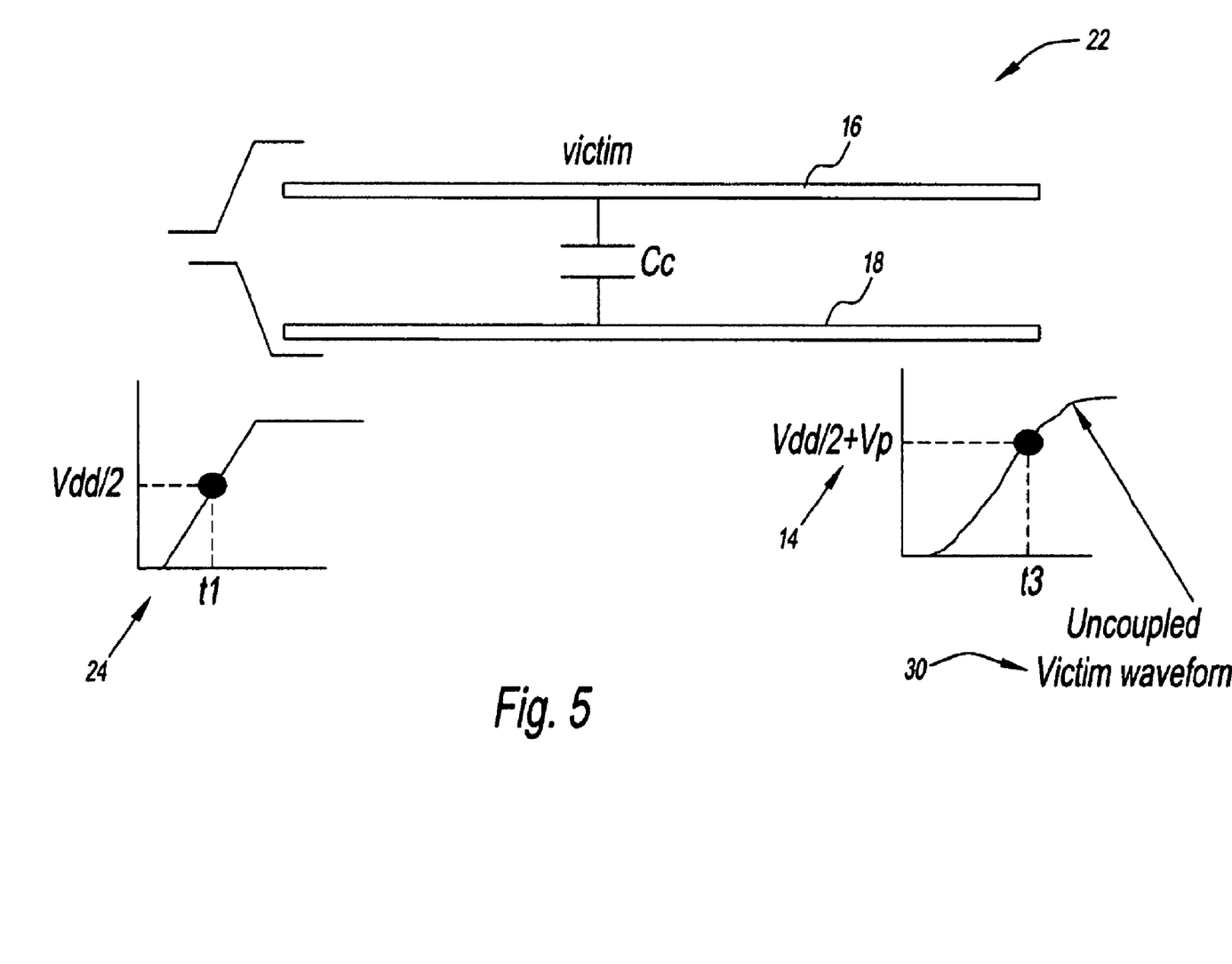
FIG. 5 is a schematic depiction of a delay computation based on the peak noise of FIG. 2.

Method 10 then computes the delay (D3) of victim net 16 in the presence of the peak noise 14 from aggressor net 18 during a third step 28. The delay (D3) is determined by the following equation:

$$D3=t3-t1$$

As illustrated in FIG. 5, times t1 and t3 are determined from the source waveform 24 and an uncoupled victim waveform 30, respectively. Advantageously, uncoupled victim waveform 30 takes the peak noise 14 into account.

Figure 6:
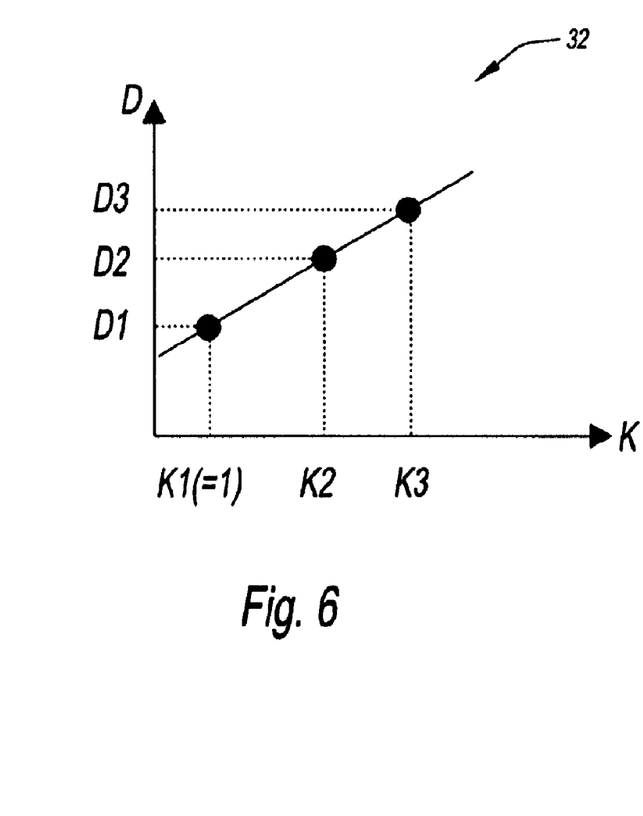
FIG. 6 is a schematic depiction of a Miller-factor computation based on the delay of FIG. 5 and the linear approximation of FIG. 4.

Method 10 determines the compensated Miller-factor (i.e., K3) at the peak noise 14 in a fourth step 32 based on the delay D3 and the slope of the linear function. Specifically, method 10 can determine the compensated Miller-factor at the delay D3 using the following equation, which is shown graphically in FIG. 6:

$$K3=(D3-D1)*(K1-K2)/(D1-D2)+1.$$

Accordingly, method 10, in simplest form, can be used to determine the compensated Miller-factor and, thus, take the coupled noise peak into account by calculating only two delays D1 and D2, which are readily available using known tools.

However, it should be recognized that second step 22 of method 10 is described above, by way of example, as determining the slope of the linear function using only two delays D1 and D2. Of course, it is contemplated by the present disclosure for second step 22 to take advantage of other linear approximations that require more than two delay points to be computed.

Figure 7:
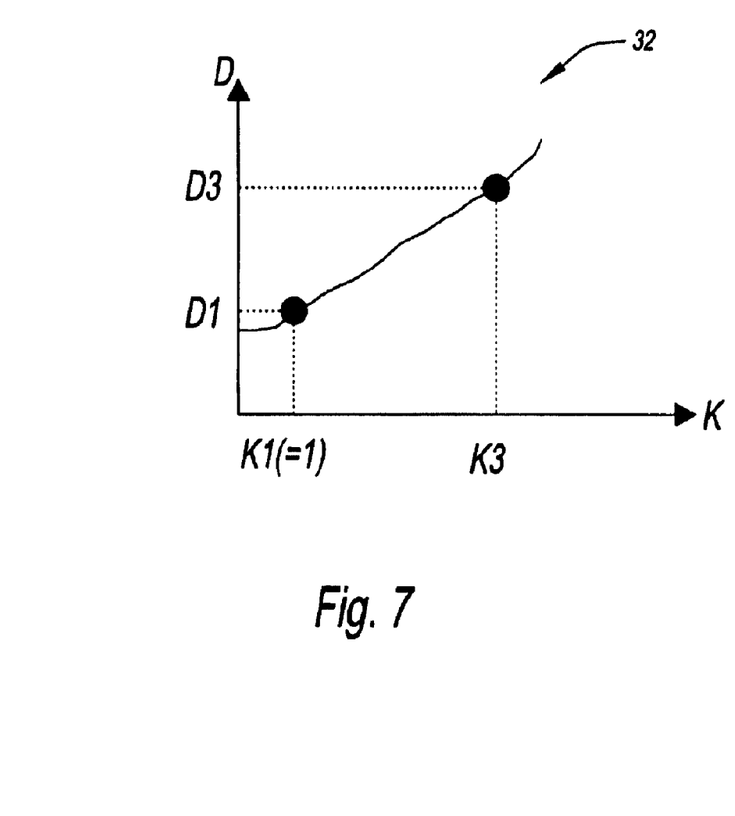
FIG. 7 is a schematic depiction of a non-linear approximation according to the present disclosure.

In addition, it is contemplated by the present disclosure for method 10 to determine the compensated Miller-function using non-linear approximations. Here, method 10 computes more than two delay points, which can be determined using known tools, to determine the equation for the non-linear function during second step 22 as shown in FIG. 7. Again, method 10 computes the delay (D3) of victim net 16 in the presence of the peak noise 14 from aggressor net 18 during third step 28 as discussed above. Finally, method 10 can determine the compensated Miller-factor (i.e., K3) at the peak noise 14 in fourth step 32 based on D3 and the equation of the non-linear function.

Advantageously, compensated Miller-factor of the present disclosure accounts for the coupled noise peak and, thus, increases the accuracy of resultant computations. Moreover, accounting for the coupled noise peak occurs without arbitrarily setting a maximum Miller-factor as in the prior art. Further, method 10 allows the overall computational flow and methodology to remain the same as with other static timing analysis and leads naturally to delay-adjust based methods as described in U.S. Pat. No. 6,615,395, which is incorporated herein by reference in its entirety. For example and referring now to FIG. 8, a timing analysis according to the present disclosure is illustrated by way of reference numeral 100. Advantageously, timing analysis 100 makes use of the compensated Miller-factor computed by method 10 discussed above.

Figure 8:
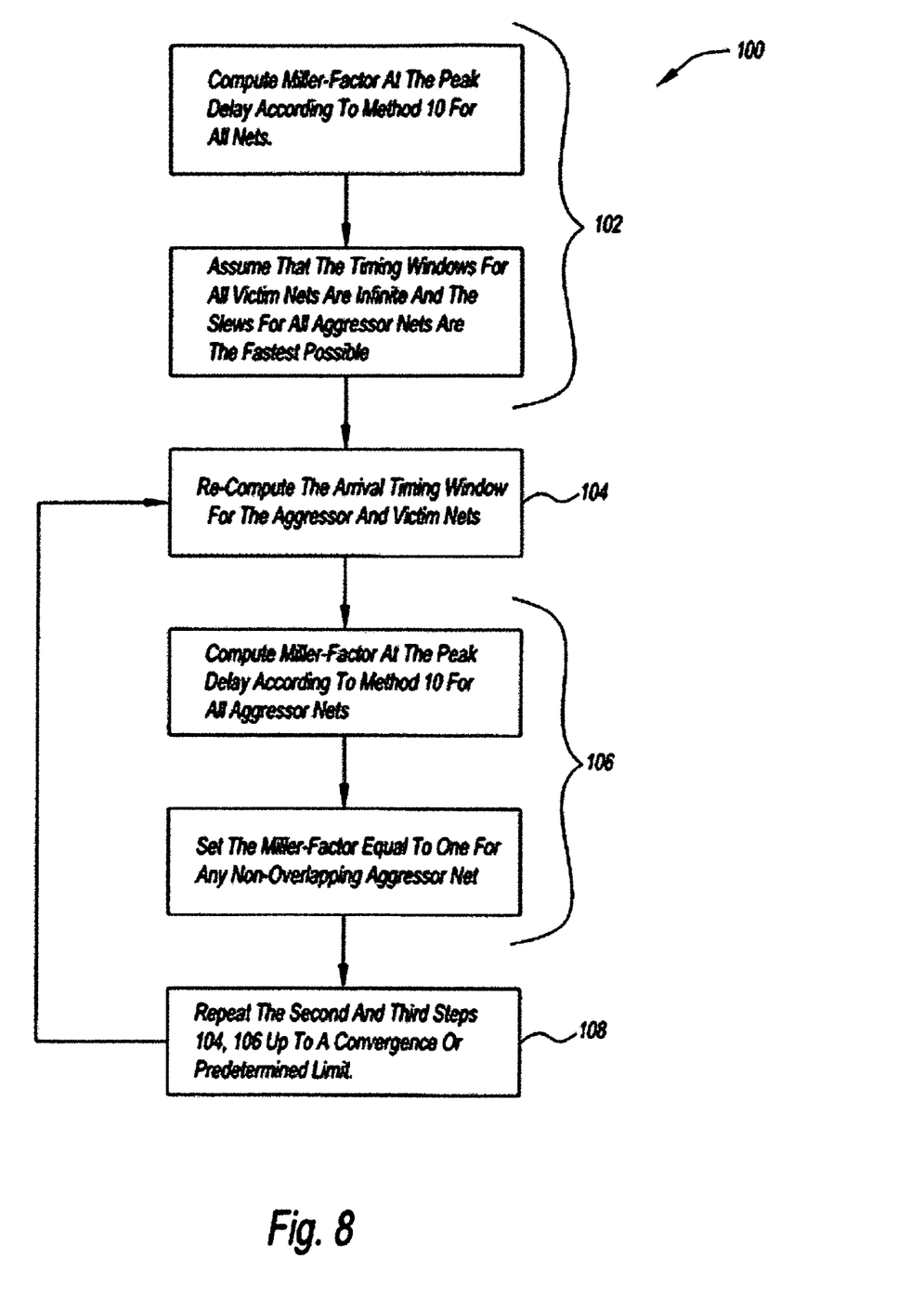
FIG. 8 is a flow chart of an exemplary embodiment of a timing analysis according to the present disclosure.

Timing analysis 100 computes the compensated Miller-factor for each victim net in the electronic circuit using method 10 in a first step 102. Analysis 100 assumes that the timing windows for all victim nets are infinite and assumes that the slews for all aggressor nets are the fastest possible.

During a second step 104, timing analysis 100 uses the compensated Miller-factors and assumptions of first step 102 to re-compute the timing windows for victim net 16 and aggressor net 18.

During a third step 106, timing analysis 100 computes the compensated Miller-factor for all aggressor nets that overlap with the victim nets and sets the Miller-factor equal to one (i.e., K=1) for any non-overlapping aggressor net.

Finally, timing analysis 100 repeats the second and third steps 104, 106 up to a convergence or predetermined limit during a fourth step 108.

Thus, timing analysis 100 starts out by computing the coupling impact at the peak noise ($V_p$) via the compensated Miller-factor computation of method 10 and, then, iterates to reduce the pessimism until convergence is achieved or some iteration limit is reached.

The terms "first", "second", "third", "upper", "lower", and the like may be used herein to modify various elements. These modifiers do not imply a spatial, sequential, or hierarchical order to the modified elements unless specifically stated.

While the present disclosure has been described with reference to one or more exemplary embodiments, it will be understood by those skilled in the art that various changes may be made and equivalents may be substituted for elements thereof without departing from the scope of the present disclosure. In addition, many modifications may be made to adapt a particular situation or material to the teachings of the disclosure without departing from the scope thereof. Therefore, it is intended that the present disclosure not be limited to the particular embodiment(s) disclosed as the best mode contemplated, but that the disclosure will include all embodiments falling within the scope of the appended claims.

What is claimed is:

1. A method for computing a compensated Miller-factor, comprising:
   mapping at least two delays as a function of at least two Miller-factors;
   determining an equation of said function;
   computing a peak noise;
   computing a peak delay resulting from said peak noise; and
   computing the compensated Miller-factor based on said equation and said peak delay.

2. The method as in claim 1, further comprising assuming said equation is a linear equation.

3. The method as in claim 2, wherein said at least two delays comprises two delays and wherein said at least two Miller-factors comprise two Miller-factors.

4. The method as in claim 2, wherein said at least two delays comprises more than two delays and wherein said at least two Miller-factors comprise more than two Miller-factors.

5. The method as in claim 1, further comprising assuming said equation is a non-lineare quation, wherein said at least two delays comprise more than two delays and wherein said at least two Miller-factors comprise more than two Miller-factors.

6. A method for computing a compensated Miller-factor, comprising:
   computing a first delay point from a first Miller-factor;
   computing a second delay point from a second Miller-factor;
   computing a peak noise;
   computing a peak delay resulting from said peak noise; and
   computing the compensated Miller-factor based on at least said first and second delay points, said first and second Miller-factors, and said peak delay.

7. The method as in claim 6, wherein said first Miller-factor is equal to one, and wherein said second Miller-factor is equal to two.

8. The method as in claim 6, wherein computing the compensated Miller-factor further comprises:
   determining an equation of said first and second delay points as a function of said first and second Miller-factors.

9. The method as in claim 8, further comprising:
   assuming said equation to be a linear equation;
   determining a slope of said linear equation based on said first and second delay points and said first and second Miller-factors; and
   computing the compensated Miller-factor based on said slope and said peak delay.

10. The method as in claim 9, wherein said slope of said linear equation is determined on more than said first and second delay points and said first and second Miller-factors.

11. The method as in claim 8, further comprising:
    assuming said equation to be a non-linear equation;
    determining said equation of said non-linear equation based on said first and second delay points, said first and second Miller-factors, and at least one additional delay point and corresponding Miller-factor; and
    computing the compensated Miller-factor based on said equation and said peak delay.

* * * * *